US012563771B2

(12) United States Patent
Nabuchi et al.

(10) Patent No.: US 12,563,771 B2
(45) Date of Patent: Feb. 24, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Yuta Nabuchi, Tokyo (JP); Hiroshi Yanagigawa, Tokyo (JP); Katsumi Eikyu, Tokyo (JP); Atsushi Sakai, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 676 days.

(21) Appl. No.: 17/886,073

(22) Filed: Aug. 11, 2022

(65) Prior Publication Data

US 2023/0112550 A1     Apr. 13, 2023

(30) Foreign Application Priority Data

Oct. 13, 2021     (JP) ................................. 2021-168077

(51) Int. Cl.
H01L 21/266 (2006.01)
H10D 30/66 (2025.01)
H10D 62/10 (2025.01)

(52) U.S. Cl.
CPC ......... H10D 30/668 (2025.01); H01L 21/266 (2013.01); H10D 62/127 (2025.01)

(58) Field of Classification Search
CPC ... H01L 21/266; H10D 30/668; H10D 62/127
See application file for complete search history.

(56) References Cited

U.S. PATENT DOCUMENTS

| | | | |
|---|---|---|---|
| 9,923,091 B2 | 3/2018 | Kudou et al. | |
| 2016/0064548 A1* | 3/2016 | Laforet | ................ H10D 12/411 |
| | | | 257/331 |
| 2016/0268369 A1* | 9/2016 | Ichimura | .............. H10D 62/111 |
| 2016/0380079 A1* | 12/2016 | Padmanabhan | ...... H10D 30/668 |
| | | | 438/270 |

(Continued)

FOREIGN PATENT DOCUMENTS

| | | |
|---|---|---|
| JP | 2017-168501 A | 9/2017 |
| JP | 2021-082770 A | 5/2021 |

OTHER PUBLICATIONS

Office Action dated Dec. 10, 2024, from corresponding Japanese Application No. 2021-168077, 8 pages.

*Primary Examiner* — Jeff W Natalini
*Assistant Examiner* — Ian Isaac Degrasse
(74) *Attorney, Agent, or Firm* — Rimon P.C.

(57) ABSTRACT

A semiconductor device and a method of manufacturing the same capable of ensuring a sufficient breakdown voltage near a terminal end portion of a cell portion are provided. The cell portion includes a first cell column region and a second cell column region adjacent to each other, and a first cell trench gate and a second cell trench gate arranged between the first cell column region and the second cell column region. An outer peripheral portion includes an outer peripheral trench gate connected to an end portion of each of the first cell trench gate and the second cell trench gate, and a first outer peripheral column region arranged on the cell portion side with respect to the outer peripheral trench gate and extended across the first cell trench gate and the second cell trench gate in plan view.

4 Claims, 18 Drawing Sheets

(56) References Cited

U.S. PATENT DOCUMENTS

| | | | | |
|---|---|---|---|---|
| 2019/0043983 A1* | 2/2019 | Moriya | ................ | H10D 62/111 |
| 2019/0181233 A1* | 6/2019 | Blank | ................ | H10D 30/0295 |
| 2021/0159331 A1* | 5/2021 | Sakai | ................... | H10D 62/127 |

\* cited by examiner

SEMICONDUCTOR DEVICE AND METHOD OF MANUFACTURING THE SAME

CROSS-REFERENCE TO RELATED APPLICATION

This disclosure of Japanese Patent Application No. 2021-168077 filed on Oct. 13, 2021 including the specification, drawings and abstract is incorporated herein by reference in its entirety.

BACKGROUND

The present invention relates to a semiconductor device and a method of manufacturing the same. The present invention is suitably applicable to, for example, a semiconductor device including an insulated gate field effect transistor and a method of manufacturing the same.

There are disclosed techniques listed below.
[Patent Document 1] Japanese Unexamined Patent Application Publication No. 2021-82770

A vertical insulated gate field effect transistor having a superjunction structure (hereinafter, referred to as SJ structure) is a power semiconductor device for controlling high voltage and large current. This semiconductor device is desirable that its on-resistance is low and its breakdown voltage is high. A semiconductor device having a vertical insulated gate field effect transistor and an SJ structure is disclosed in, for example, Patent Document 1.

SUMMARY

Patent Document 1 discloses a vertical insulated gate field effect transistor having the SJ structure, in which a plurality of trench gates are arranged between two p-type column regions adjacent to each other. An effect of on-resistance reduction is expected because a current path at the time of turning on is increased by providing a plurality of trench gates.

However, in the structure described in Patent Document 1, since a place where a depletion does not occur locally in a vicinity of a terminal end portion of a cell portion occurs, a sufficient breakdown voltage cannot be secured in the vicinity of the terminal end portion of the cell portion.

Other problems and novel features will become apparent from the description herein and from the accompanying drawings.

A semiconductor device according to an embodiment includes a cell portion including an insulated gate field effect transistor, and a outer peripheral portion located outside the cell portion. The cell portion includes a first cell column region and a second cell column region adjacent to each other, and a first cell trench gate and a second cell trench gate arranged between the first cell column region and the second cell column region. The outer peripheral portion includes an outer peripheral trench gate connected to end portions of each of the first cell trench gate and the second cell trench gate, and a first outer peripheral column region arranged on the cell portion side with respect to the outer peripheral trench gate and extended across the first cell trench gate and the second cell trench gate in plan view.

A semiconductor device according to another embodiment includes a cell portion including an insulated gate field effect transistor, and an outer peripheral portion located outside the cell portion. The cell portion includes a first cell column region and a second cell column region adjacent to each other, and a first cell trench gate and a second cell trench gate arranged between the first cell column region and the second cell column region. The outer peripheral portion includes an outer peripheral trench gate connected to an end portion of each of the first cell trench gate and the second cell trench gate, and an outer peripheral column region arranged directly below the outer trench gate.

According to a method of manufacturing a semiconductor device according to an embodiment, a first cell trench gate and a second cell trench gate adjacent to each other in plan view is formed in a cell portion, and an outer peripheral trench gate connected to an end portion of each of the first cell trench gate and the second cell trench gate in plan view is formed on an outer peripheral portion. The first cell column region and the second cell column region sandwiching the first cell trench gate and the second cell trench gate in plan view is formed on the semiconductor substrate of the cell portion. An outer peripheral column region is formed on a semiconductor substrate of the outer peripheral portion on the cell portion side with respect to the outer peripheral trench gate. The outer peripheral column region is formed so as to be extended across the first cell trench gate and the second cell trench gate in plan view.

According to a method of manufacturing a semiconductor device according to another embodiment, a first cell trench gate and a second cell trench gate adjacent to each other in plan view are formed in a cell portion, and an outer peripheral trench gate connected to end portions of each of the first cell trench gate and the second cell trench gate in plan view is formed on an outer peripheral portion. A first cell column region and a second cell column region sandwiching the first cell trench gate and the second cell trench gate in plan view are formed on the semiconductor substrate of the cell portion, and an outer peripheral column region is formed on the semiconductor substrate of the outer peripheral portion directly below the outer peripheral trench gate.

According to the above-described embodiments, it is possible to realize a semiconductor device and a method of manufacturing the same capable of securing a sufficient withstand voltage in a vicinity of a terminal end of the cell portion.

BRIEF DESCRIPTIONS OF THE DRAWINGS

DETAILED DESCRIPTION

Figure 1:
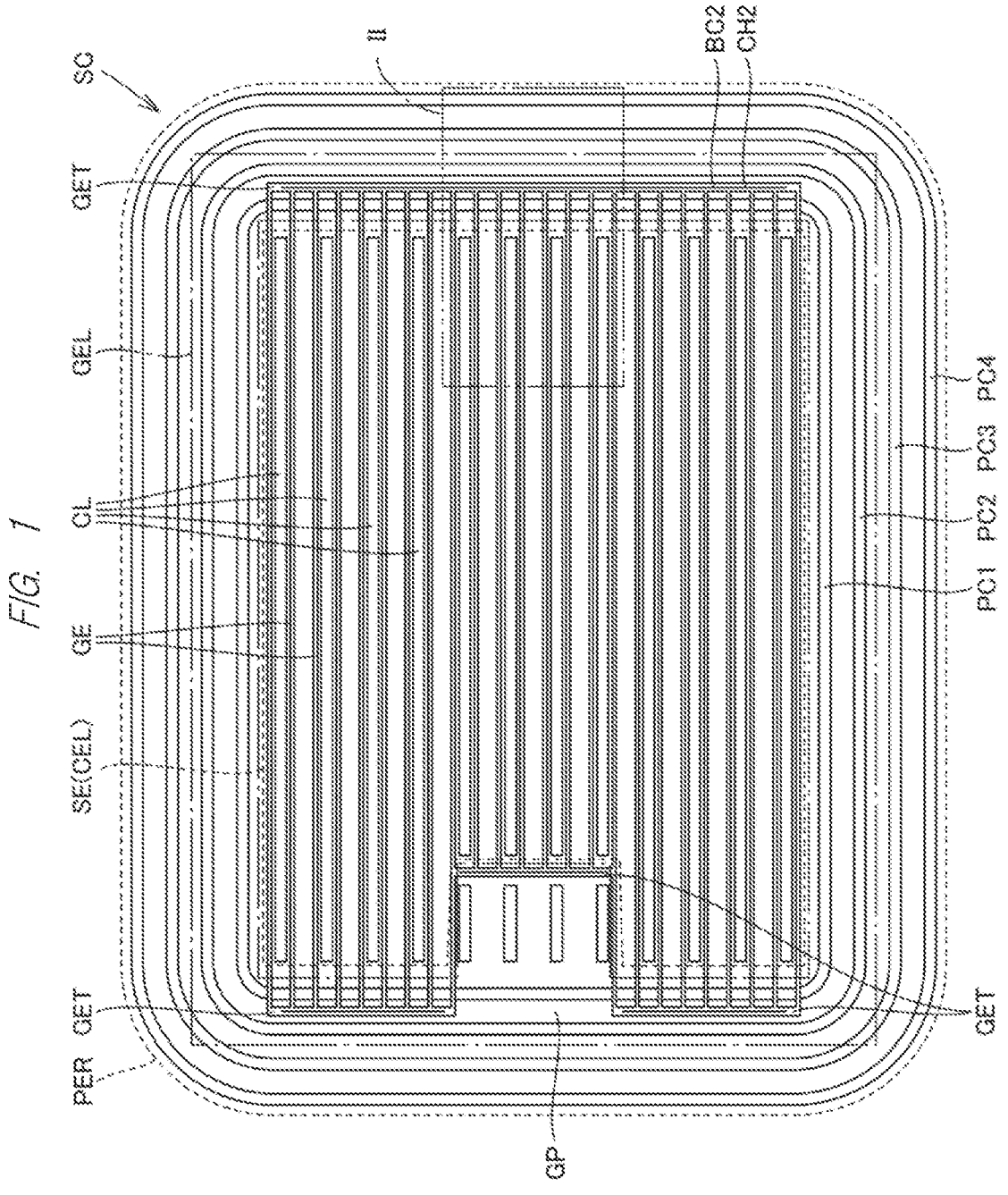
FIG. 1 is a plan view illustrating a configuration in a chip state of the semiconductor device according to a first embodiment.

Hereinafter, embodiments of the present disclosure will be described in detail with reference to the accompanying drawings. In the specification and drawings, the same or corresponding components are denoted by the same reference numerals, and a repetitive description thereof is not repeated. In the drawings, for convenience of description, the configuration or the manufacturing method may be omitted or simplified. Also, at least a portion of each embodiment may be optionally combined with each other.

A semiconductor device of an embodiment described below is not limited to a semiconductor chip, and may be a semiconductor wafer before being divided into semiconductor chips, and also the semiconductor chip may be a semiconductor package sealed with a resin. The wording "in plan view" in this specification means a viewpoint viewed from a direction perpendicular to a main surface of the semiconductor substrate (first surface FS).

Embodiment 1

<Configuration of Semiconductor Device in Chip State>

First, a configuration of a chip state as a configuration of a semiconductor device according to a first embodiment will be described with reference to FIG. 1.

As illustrated in FIG. 1, a semiconductor device SC according to the first embodiment is a power semiconductor device. The semiconductor device SC includes a vertical insulated gate field effect transistor having an SJ structure. The insulated gate field effect transistor is, for example, a MOS (metal oxide semiconductor) transistor. However, a gate insulation film of the insulated gate field effect transistor is not limited to a silicon oxide film, and may be another insulating film. For this reason, the insulated gate field effect transistor may be a MIS (metal insulator semiconductor) transistor.

The semiconductor device SC includes, in plan view, a cell portion CEL and an outer peripheral portion PER. The cell portion CEL includes an insulated gate field effect transistor. The insulated gate field effect transistor includes a plurality of cell trench gates GE and a plurality of cell column regions CL.

The plurality of cell column regions CL are extended in parallel as they are extended in the same direction to each other in plan view. The plurality of cell trench gates GE are extended in parallel as they are extended in the same direction to each other in plan view. In plan view, the direction in which each of the plurality of cell trench gates GE is extended is the same as the direction in which each of the plurality of cell column regions CL is extended.

The plurality of cell column regions CL include a first cell column region CL and a second cell column region CL adjacent to each other in plan view. The plurality of cell trench gates GE include a first cell trench gate GE and a second cell trench gate GE arranged between the first cell column region CL and the second cell column region CL adjacent to each other. Three or more cell trench gates GE may be arranged between the first cell column region CL and the second cell column region CL adjacent to each other.

The semiconductor device SC includes a source electrode SE. The source electrode SE is electrically coupled to a source region of the insulated gate field effect transistor. The source electrode SE is arranged so as to overlap with the cell portion CEL in plan view. In FIG. 1, the cell portion CEL is formed in a region surrounded by a broken line labeled with the reference symbol CEL.

The outer peripheral portion PER is located outside the cell portion CEL in plan view. The outer peripheral portion PER surrounds an outer periphery of the cell portion CEL in plan view. The outer peripheral portion PER has a plurality of outer peripheral column regions PC1, PC2, PC3 and PC4, and an outer peripheral trench gate GET. Incidentally, the outer peripheral portion PER in FIG. 1 is a region surrounded by a broken line with the reference symbol PER and a broken line with the reference symbol CEL.

The plurality of outer peripheral column regions PC1, PC2, PC3 and PC4 are arranged so as to surround the entire periphery of the cell portion CEL in plan view. The plurality of outer peripheral column regions PC1, PC2, PC3 and PC4 are arranged in this order from the inner peripheral side to the outer peripheral side. In other words, the outer peripheral column region PC1 of the plurality of outer peripheral column regions PC1, PC2, PC3 and PC4 is located on the most inner peripheral side, and the outer peripheral column region PC4 is located on the most outer peripheral side.

The outer peripheral trench gate GET is connected to an end in a plan view of each of the plurality of cell trench gates GE. To the outer peripheral trench gate GET, the gate electrode wiring GEL is electrically coupled via a conductive layer BC2. The conductive layer BC2 is embedded in a contact hole CH2 formed in an interlayer insulating layer (not illustrated).

A gate electrode wiring GEL has an annular shape in plan view and is arranged so as to surround the periphery of the source electrode SE. The gate electrode wiring GEL includes a gate electrode pad GP for connection with the outside. The gate electrode wiring GEL is arranged in a region surrounded by a two one-dot chain line in FIG. 1.

The outer peripheral column region PC1 (first outer peripheral column region) is extended continuously without interruption over the entire extending direction of the outer peripheral trench gate GET in plan view (the longitudinal direction of the outer peripheral trench gate GET in plan view). The outer peripheral column region PC1 is extended over the entire width of the cell portion CEL in plan view. The width direction of the cell portion CEL in the description above is a direction in which the plurality of cell trench gates GE are aligned, and also a direction in which the outer peripheral trench gate GET is extended.

The outer peripheral column region PC2 (second outer peripheral column region) sandwiches the outer peripheral trench gate GET between itself and the outer peripheral column region PC1 in plan view. The outer peripheral column region PC2 extends continuously over the entire extending direction of the outer peripheral trench gate GET without interruption in plan view. The outer peripheral column region PC2 is extended over the entire width of the cell portion CEL in plan view. Thus, in plan view, the outer peripheral trench gate GET, over the entire length, is sandwiched between the outer peripheral column region PC1 and the outer peripheral column region PC2.

Figure 2:
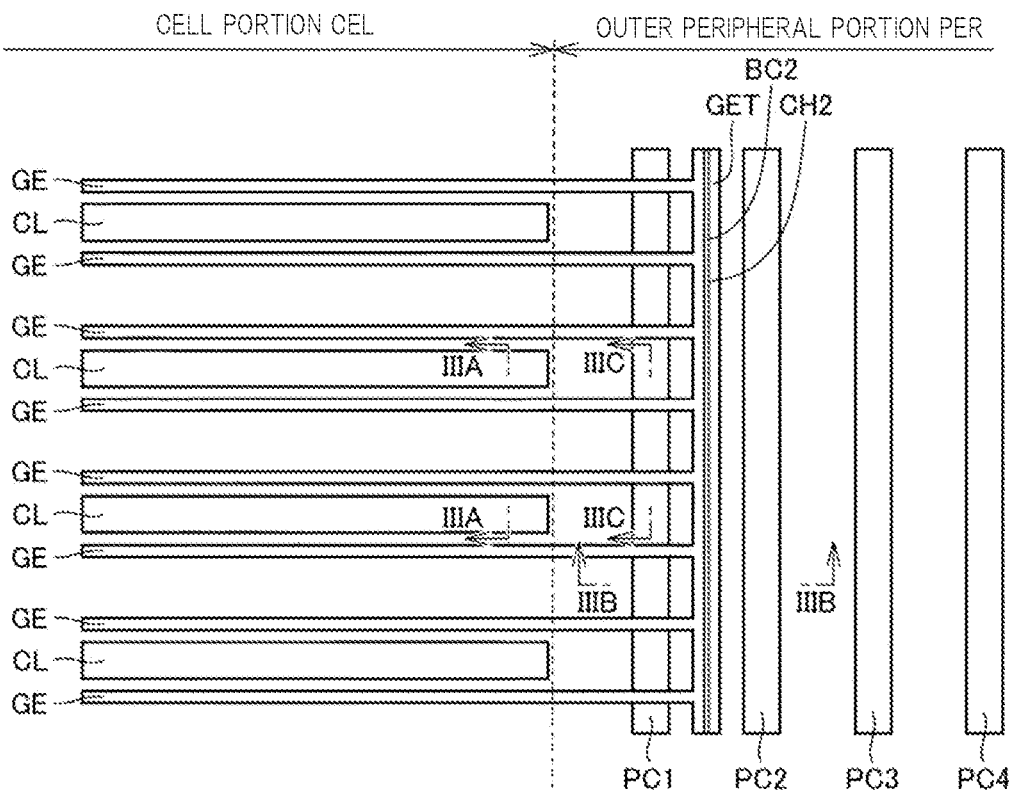
FIG. 2 is an enlarged plan view of a region II of FIG. 1.

As illustrated in FIG. 2, the outer peripheral column region PC1, in plan view, is arranged on the side of the cell portion CEL with respect to the outer peripheral trench gate GET. The outer peripheral column region PC1 is extended across the plurality of cell trench gates GE in plan view. That is, in plan view, the outer peripheral column region PC1 intersects each of the plurality of cell trench gates GE.

Figures 3A, 3B, 3C:
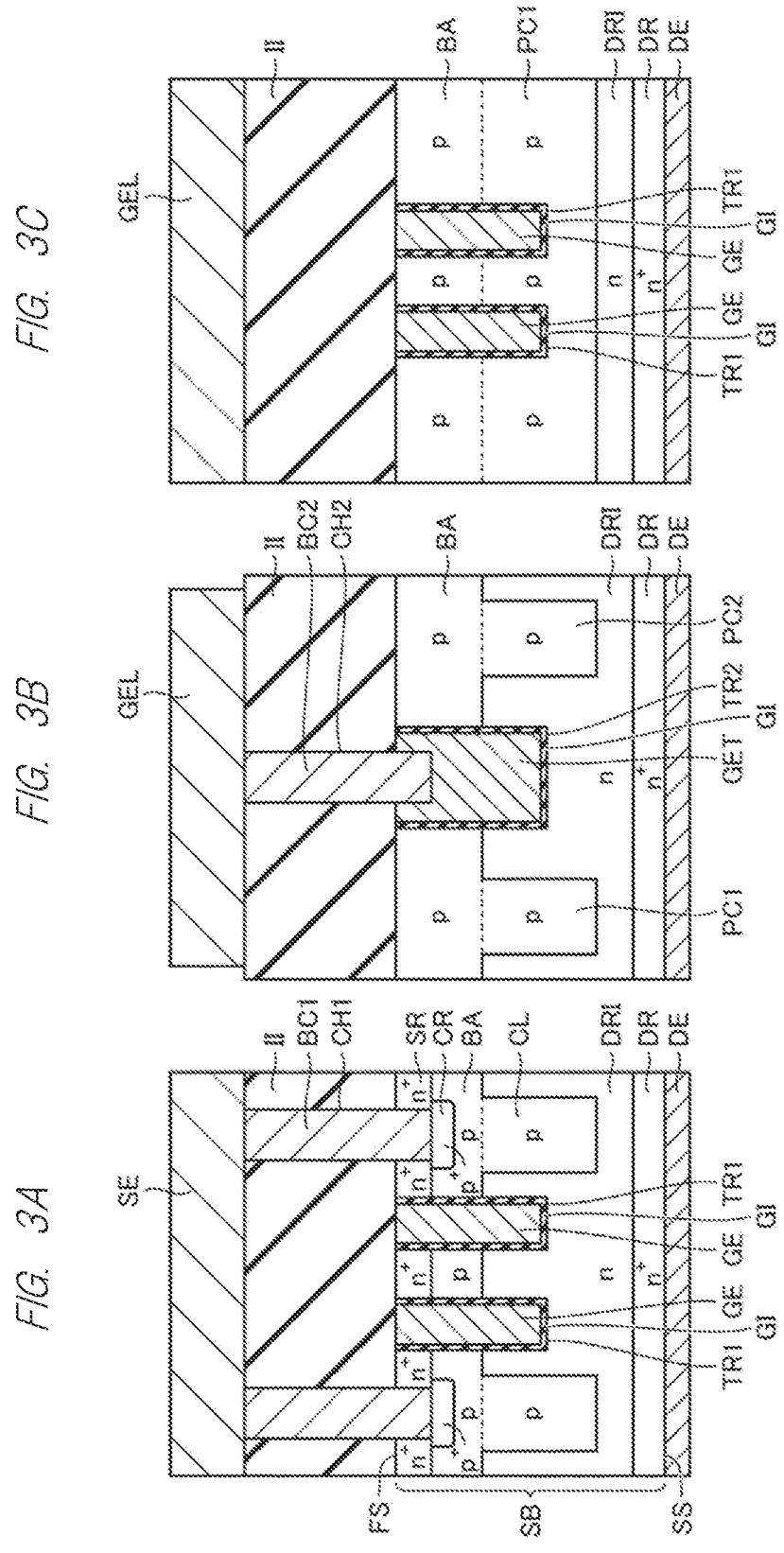
FIG. 3A is a cross-sectional view taken along a IIIA-IIIA line of FIG. 2.
FIG. 3B is a cross-sectional view taken along a IIIB-IIIB line of FIG. 2.
FIG. 3C is a cross-sectional view taken along a IIIC-IIIC line of FIG. 2.

As illustrated in FIG. 3A, the semiconductor substrate SB has a first surface FS (main surface), and a second surface SS. The first surface FS and the second surface SS face each other. The semiconductor substrate SB is formed of, for example, single crystal silicon.

An insulated gate field effect transistor is formed in the semiconductor substrate SB in the cell portion CEL. The insulated gate field effect transistor is a vertical transistor for passing a current between the first surface FS and the second surface SS of the semiconductor substrate SB.

The insulated gate field effect transistor includes an $n^+$-type drain region DR, an n-type drift region DRI, a p-type base region BA, a $p^-$-type contact region CR, an $n^+$-type source region SR, a p-type cell column region CL, and a cell trench gate GE.

The $n^+$-type drain region DR is arranged on the second surface SS of the semiconductor substrate SB. The n-type drift region DRI is arranged on the first surface FS side with respect to the n-type drain region DR so as to be in contact with the $n^+$-type drain region DR. The n-type drift region DRI has a lower n-type impurity concentration than a n-type impurity concentration of the $n^+$-type drain region DR.

The p-type base region BA is arranged on the first surface FS side with respect to the n-type drift region DRI to form a pn junction with the n-type drift region DRI. The $p^+$-type contact region CR is in contact with the p-type base region BA. The $p^+$-type contact region CR has a p-type impurity concentration higher than a p-type impurity concentration of the p-type base region BA. The $n^+$-type source region SR forms a pn junction with the p-type base region BA and is arranged on the first surface FS of the semiconductor substrate SB.

The p-type cell column region CL is connected to the p-type base region BA at the end portion of the second surface SS side of the p-type base region BA. The p-type cell column region CL is extended from the end portion of the second surface SS side of the p-type base region BA toward the second surface SS. Thus, the p-type cell column region CL protrudes from the end portion of the p-type base region BA on the second surface SS side to the second surface SS. The p-type cell column region CL forms a pn junction with the n-type drift region DRI. The p-type cell column region CL has a p-type impurity concentration similar to a p-type impurity concentration of the p-type base region BA. The p-type cell column region CL is extended to a position closer to the second surface SS than the cell trench gate GE. As the plurality of p-type cell column region CL protrudes into the n-type drift region DRI, the periodic repetitive structure of the p-type region and the n-type region is formed, so that the SJ structure is formed.

The semiconductor substrate SB includes a cell trench TR1 in the first surface FS. The cell trench TR1 penetrates through each of the $n^+$-type source region SR and the p-type base region BA from the first surface FS and reaches the n-type drift region DRI. The gate insulating layer GI is arranged along the wall surface of the cell trench TR1. The gate insulating layer GI is formed of, for example, a silicon oxide film but not limited to a silicon oxide film.

The cell trench gate GE is embedded in the cell trench TR1. The cell trench gate GE is formed of, for example, polycrystalline silicon (doped polysilicon) into which impurities are introduced. The cell trench gate GE is opposed to the p-type base region BA via the gate insulating layer GI. A plurality of (e.g., two) cell trench gates GE are arranged between the p-type cell column regions CL adjacent to each other.

On the first surface FS of the semiconductor substrate SB, an interlayer insulating layer II is arranged. The interlayer insulating layer II is formed of, for example, a silicon oxide film. The interlayer insulating layer II includes a BPSG (boro-phospho silicate glass) film that is formed using TEOS (tetra ethyl ortho silicate) as a raw material.

The contact hole CH1 is formed in the interlayer insulating layer II. The contact hole CH1 reaches the semiconductor substrate SB, penetrating through the interlayer insulating layer II. The contact hole CH1 has a bottom portion located on the second surface SS side than the first surface FS of the semiconductor substrate SB. The p$^+$-type contact region CR is located at the bottom of the contact hole CH1.

A conductive layer BC1 is embedded in the contact hole CH1. The conductive layer BC1 is connected to each of the n$^+$-type source region SR and the p-type contact region CR. The conductive layer BC1 includes a barrier metal layer and a buried conductive layer. The barrier metal layer is extended along each wall of the contact holes CH1 and CH2 and formed of, for example, a stacked film of titanium (Ti) and titanium nitride (TiN). The buried conductive layer is embedded in the interior of each of the contact holes CH1 and CH2. The buried conductive layer is formed of tungsten (W), for example.

The source electrode SE is arranged on the interlayer insulating layer II. The source electrode SE is electrically coupled to each of the n-type source region SR and the p-type contact region CR via the conductive layer BC1.

A drain electrode DE is arranged on the second surface SS of the semiconductor substrate SB. The drain electrode DE is electrically coupled to the n$^+$-type drain region DR as it is in contact with the n$^+$-type drain region DR.

As illustrated in FIG. 3B, the outer peripheral trench TR2 located in the outer peripheral portion PER reaches the n-type drift region DRI, penetrating through the p-type base region BA from the first surface FS of the semiconductor substrate SB. The gate insulating layer GI is arranged along a wall surface of the outer peripheral trench TR2. The gate insulating layer GI is formed of, for example, a silicon oxide film but not limited to a silicon oxide film.

The outer peripheral trench gate GET is embedded in the outer peripheral trench TR2. The outer peripheral trench gate GET is formed of, for example, doped polysilicon.

In the outer peripheral portion PER, each of the outer peripheral column regions PC1 and PC2 is connected to the p-type base region BA at the end portion of the second surface SS side of the p-type base region BA. Each of the outer peripheral column regions PC1 and PC2 is extended from the end portion of the second surface SS side of the p-type base region BA toward the second surface SS. Thus, each of the outer peripheral column regions PC1 and PC2 protrudes from the end portion of the second surface SS side of the p-type base region BA to the second surface SS. Each of the outer peripheral column regions PC1 and PC2 forms a pn junction with the n-type drift region DRI. Each of the outer peripheral column regions PC1 and PC2 has a p-type impurity concentration similar to a p-type impurity concentration of the p-type base region BA.

Although not illustrated, each of the outer peripheral column regions PC3 and PC4 has the same configuration as the configuration of the outer peripheral column regions PC1 and PC2.

The outer peripheral trench gate GET is arranged between the outer peripheral column regions PC1 and PC2 adjacent to each other. Each of the outer peripheral column regions PC1 and PC2 is extended to a position closer to the second surface SS than the outer peripheral trench TR2 in which the outer peripheral trench gate GET is embedded. That is, the end portion of each of the outer peripheral column regions PC1 and PC2 on the second surface SS side is located closer to the second surface SS than the end portion of the outer peripheral trench TR2 on the second surface SS side.

The contact hole CH2 is formed in the interlayer insulating layer II on the first surface FS of the semiconductor substrate SB. The contact hole CH2 reaches the semiconductor substrate SB, penetrating through the interlayer insulating layer II. The contact hole CH2 has a bottom located on the second surface SS side than the first surface FS of the semiconductor substrate SB. The contact hole CH1 reaches the outer peripheral trench gate GET.

The conductive layer BC2 is embedded in the contact hole CH2. The conductive layer BC2 is connected to the outer trench gate GET. The conductive layer BC2 has the same configuration as the conductive layer BC1.

The gate electrode wiring GEL is arranged on the interlayer insulating layer II. The gate electrode wiring GEL is electrically coupled to the outer peripheral trench gate GET via the conductive layer BC2.

As illustrated in FIG. 3C, in the outer peripheral portion PER, the outer peripheral column region PC1 is extended across the plurality of cell trench gates GE. The outer peripheral column region PC1 is extended to a position closer to the second surface SS than the cell trench TR1 in which the cell trench gate GE is embedded. That is, the end portion of the outer peripheral column region PC1 on the second surface SS side is located closer to the second surface SS than the end portion of the cell trench TR1 on the second surface SS side. Therefore, the outer peripheral column region PC1 is in contact with the bottom surface of the cell trench TR1.

<Method of Manufacturing Semiconductor Device>

Next, a method of manufacturing the semiconductor device according to the present embodiment will be described with reference to FIGS. 4A and 4B to FIGS. 8A and 8B.

Figures 4A, 4B:
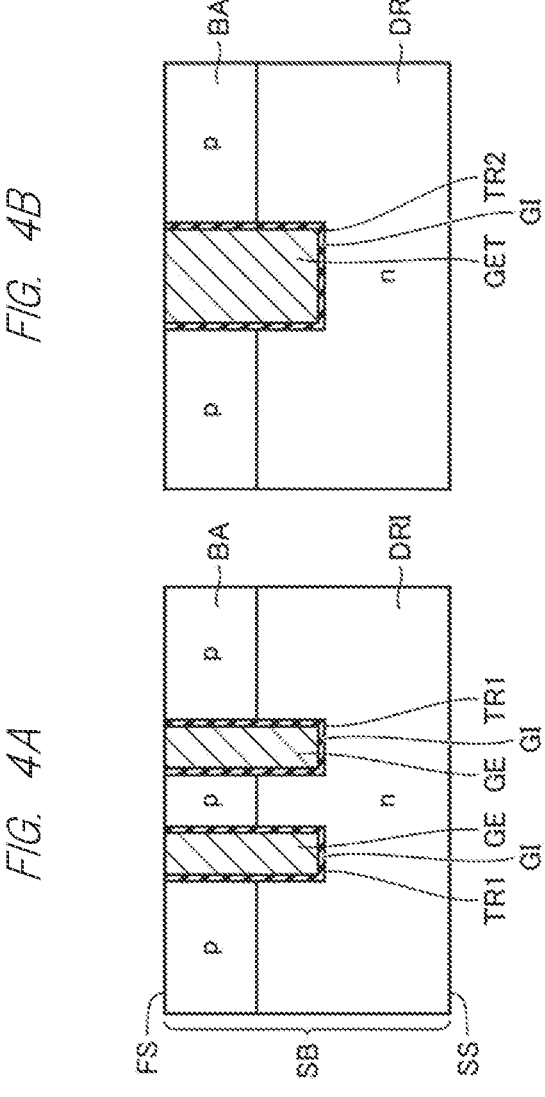
FIG. 4A is a cross-sectional view illustrating a first step of a method of manufacturing the semiconductor device according to the first embodiment.
FIG. 4B is a cross-sectional view illustrating the first step of a method of manufacturing the semiconductor device according to the first embodiment.

As illustrated in FIGS. 4A and 4B, first, the semiconductor substrate SB is prepared. To the first surface FS of the semiconductor substrate SB, a plurality of the cell trenches TR1 and a plurality of the outer peripheral trenches TR2 are formed. The plurality of cell trenches TR1 are formed to be extended in parallel to each other in plan view. The peripheral trench TR2 is formed so as to be connected to an end portion of each of the plurality of cell trenches TR1 in plan view.

The gate insulating layer GI is formed on a wall of each of the cell trench TR1 and the outer peripheral trench TR2. The cell trench gate GE is formed in the cell trench TR1 and the outer peripheral trench gate GET is formed in the outer peripheral trench TR2. The plurality of cell trench gates GE are formed to include the first cell trench gate GE and the second cell trench gate GE adjacent to each other in plan view. The peripheral trench gate GET is formed to be connected to an end portion in plan view of each of the plurality of cell trench gates GE.

Thereafter, on the first surface FS of the semiconductor substrate SB, the p-type base region BA is formed. The p-type base region BA is formed shallower than each of the cell trench TR1 and the outer peripheral trench TR2.

Figures 5A, 5B:
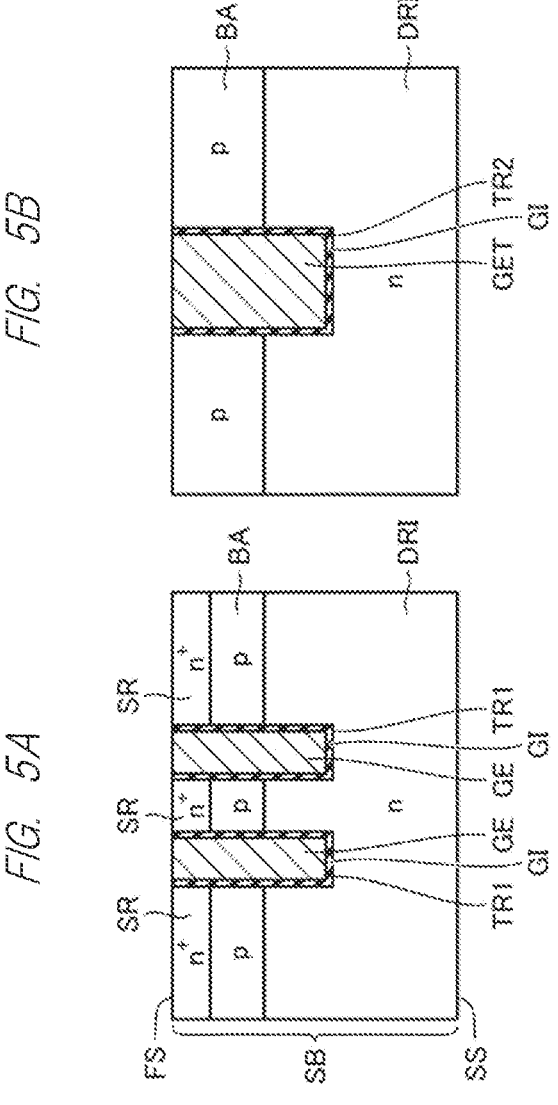
FIG. 5A is a cross-sectional view illustrating a second step of the method of manufacturing the semiconductor device according to the first embodiment.
FIG. 5B is a cross-sectional view illustrating the second step of the method of manufacturing the semiconductor device according to the first embodiment.

As illustrated in FIGS. 5A and 5B, in the cell portion CEL, n-type impurities such as arsenic is ion-implanted into the first surface FS of the semiconductor substrate SB. Thus, the n$^+$-type source region SR is formed in the first surface FS of the semiconductor substrate SB in the cell portion CEL.

Figures 6A, 6B:
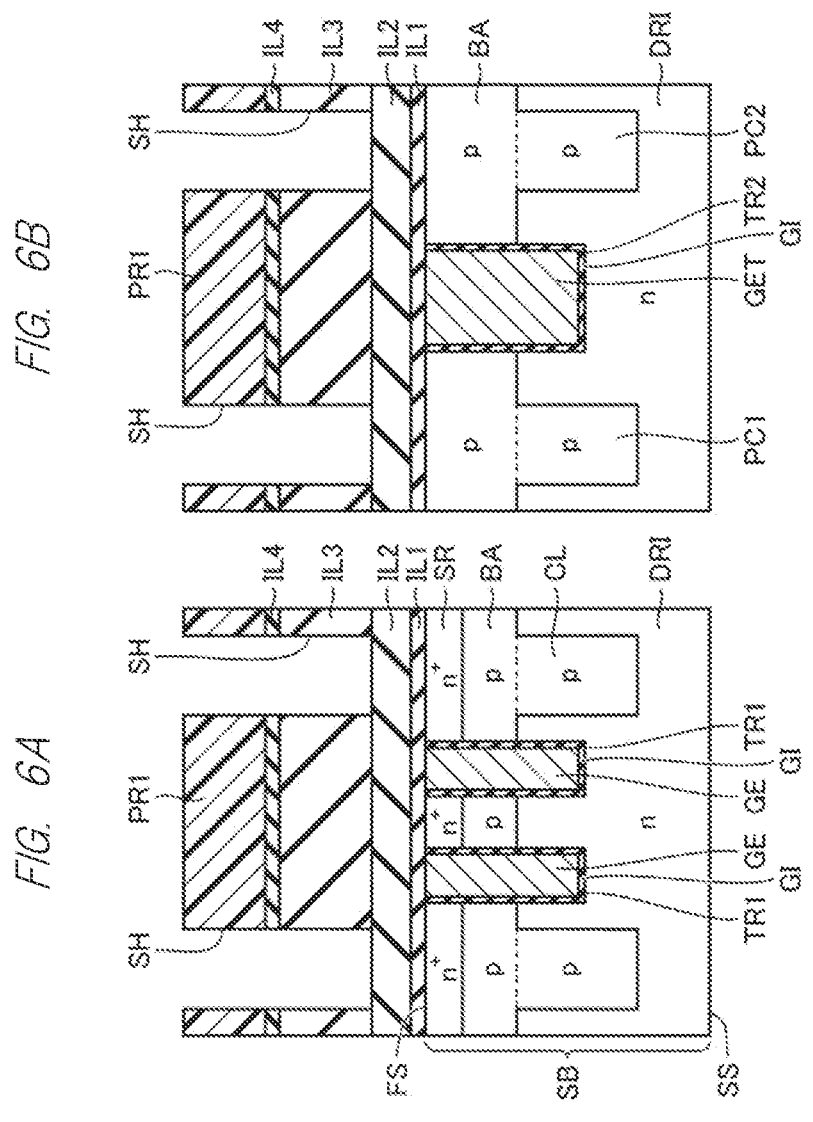
FIG. 6A is a cross-sectional view illustrating a third step of the method of manufacturing the semiconductor device according to the first embodiment.
FIG. 6B is a cross-sectional view illustrating the third step of the method of manufacturing the semiconductor device according to the first embodiment.

As illustrated in FIGS. 6A and 6B, on the first surface FS of the semiconductor substrate SB, a silicon oxide film IL1, a silicon nitride film IL2, a silicon oxide film IL3 and a silicon oxide film IL4 are stacked in this order. A photo resist PR1 is applied on the silicon oxide film IL4. Thereafter, the photo resist PR1 is patterned by photolithography techniques (exposure and development, etc.).

Using the patterned photoresist PR1 as a mask, the silicon oxide films IL4 and IL3 are subjected to a plasma etching.

Thus, the silicon oxide films IL4 and IL3 are selectively etched, so that a portion of the silicon nitride film IL2 is exposed.

In this state, p-type impurities such as boron are ion-implanted from the first surface FS side of the semiconductor substrate SB. As a result, a plurality of the cell column regions CL are formed in the cell portion CEL, and a plurality of the outer peripheral column regions PC1 to PC4 are formed in the outer peripheral portion PER. In plan view, the cell column regions CL adjacent to each other are formed in the semiconductor substrate SB so as to sandwich, for example, two cell trench gates GE. The outer peripheral column region PC1 is formed on the cell portion CEL side of the outer peripheral trench gate GET. The outer peripheral column regions PC1 and PC2 adjacent to each other are formed so as to sandwich the outer peripheral trench gate GET. The outer peripheral column region PC1 is formed so as to be extended across the plurality of cell trench gates GE.

Thereafter, the photo resist PR1 is stripped to be removed. The silicon oxide films IL4 and IL3 are etched. The silicon nitride film IL2 is removed by wet etching.

Thereafter, on the silicon oxide film IL1, for example, a BPSG film formed using TEOS as a raw material is formed.

Figures 7A, 7B:
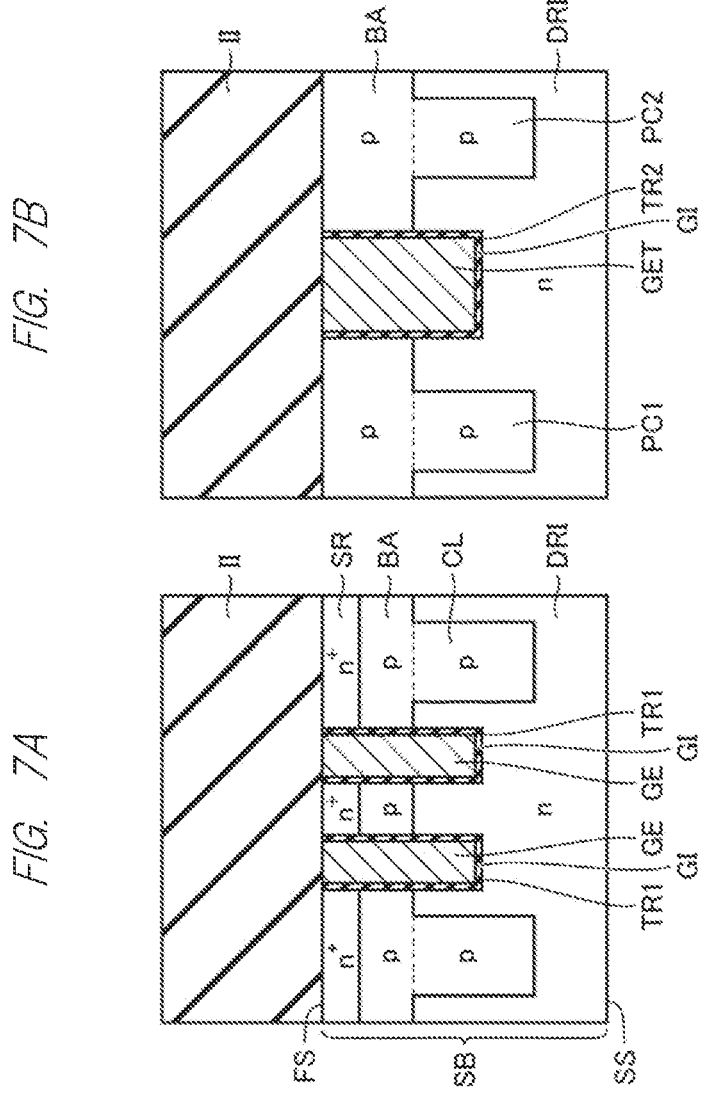
FIG. 7A is a cross-sectional view illustrating a fourth step of the method of manufacturing the semiconductor device according to the first embodiment.
FIG. 7B is a cross-sectional view illustrating the fourth step of the method of manufacturing the semiconductor device according to the first embodiment.

As illustrated in FIGS. 7A and 7B, the interlayer insulating layer II is formed of the silicon oxide film IL1, the BPSG film and so forth on the first surface FS of the semiconductor substrate SB.

Figures 8A, 8B:
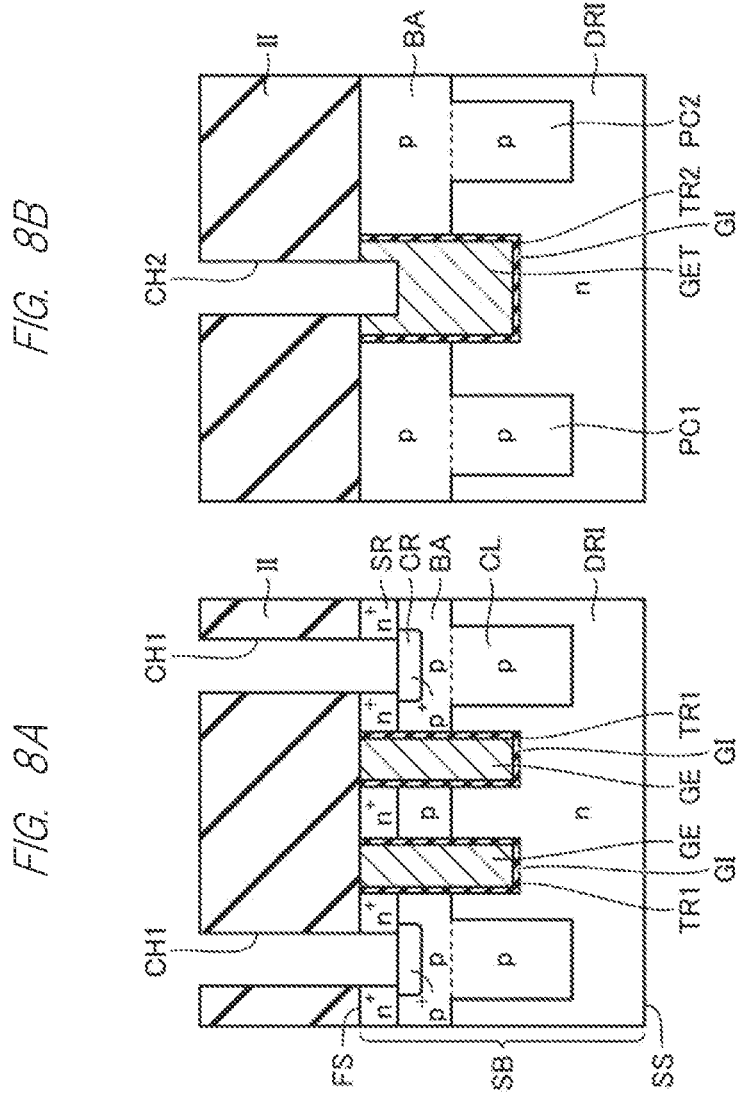
FIG. 8A is a cross-sectional view illustrating a fifth step of the method of manufacturing the semiconductor device according to the first embodiment.
FIG. 8B is a cross-sectional view illustrating the fifth step of the method of manufacturing the semiconductor device according to the first embodiment.

As illustrated in FIGS. 8A and 8B, the contact holes CH1, CH2 are formed in the interlayer insulating layer II by a photolithography technique and an etching technique. The contact hole CH1 not only penetrates through the interlayer insulating layer II but also through the n$^+$-type source-region SR to reach the p-type base region BA. The contact hole CH2 is formed so as to penetrate through the interlayer insulating layer II to reach the outer peripheral trench gate GET.

Thereafter, boron fluoride ions are implanted into the semiconductor substrate SB through the contact hole CH1. In this manner, the p$^+$-type contact region CR is formed directly below the contact hole CH1.

As illustrated in FIGS. 3A and 3B, the conductive layers BC1 and BC2 are formed in the contact holes CH1 and CH2, respectively. Each of the conductive layers BC1 and BC2 includes a barrier metal layer and a buried conductive layer. The barrier metal layer is formed along each wall of the contact holes CH1 and CH2, and formed of, for example, a stacked film of titanium and titanium nitride. The buried conductive layer is embedded in the inside of each of the contact holes CH1 and CH2. The buried conductive layer is formed of, for example, tungsten.

On the interlayer insulating layer II, a conductive layer formed of, for example, aluminum or aluminum-copper is formed. The conductive layer is patterned by photolithography and etching techniques. In this manner, the source electrode SE and the gate electrode wiring GEL are formed of the conductive layer. The source electrode SE is electrically coupled to each of the n$^+$-type source region SR and the p$^+$-type contact region CR via the conductive layer BC1. The gate electrode wiring GEL is electrically coupled to the outer peripheral trench gate GET via the conductive layer BC2.

As described above, the semiconductor device of the present embodiment illustrated in FIG. 3 is manufactured.

<Effect>

Next, an effect of the present embodiment will be described in comparison with a first comparative example illustrated in FIGS. 9 and 10 and a second comparative example illustrated in FIGS. 11 and 12.

Figure 9:
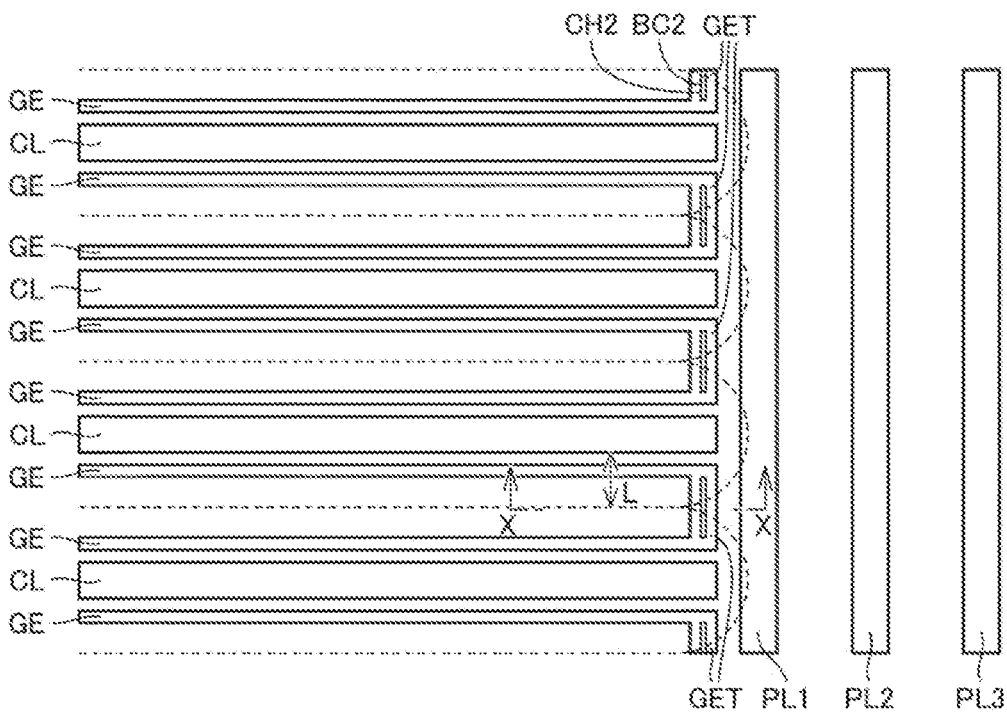
FIG. 9 is a plan view illustrating a configuration of a semiconductor device according to a first comparative example.
Figure 10:
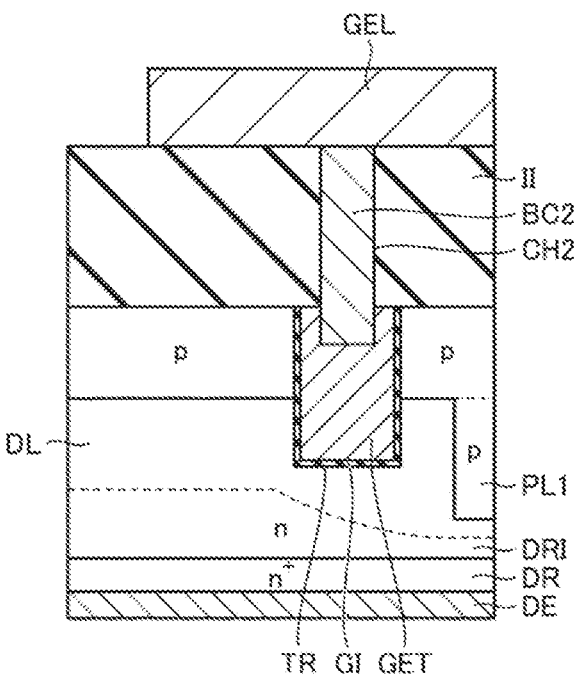
FIG. 10 is a cross-sectional view taken along an X-X line of FIG. 9.

A first comparative example illustrated in FIG. 9 is a configuration illustrated in FIG. 23 of Patent Document 1. In the first comparative example illustrated in FIG. 9, the end portion of each of the two cell trench gates GE sandwiched between adjacent cell column regions CL is connected by the outer peripheral trench gate GET.

In the configuration of the first comparative example, the cell column region CL is not arranged on the cell portion side of the outer peripheral trench gate GET. A distance L between a center position of the two cell trench gates GE and the cell column region CL is relatively large. Therefore, if a variation in the quality of a line width of the cell column region CL occurs, as illustrated in FIG. 10, since the depletion layer DL is less likely to extend in the vicinity of the cell portion side of the outer trench gate GET, an electric field concentration is more likely to occur and thus lowering of the breakdown voltage is more likely to occur.

Figure 11:
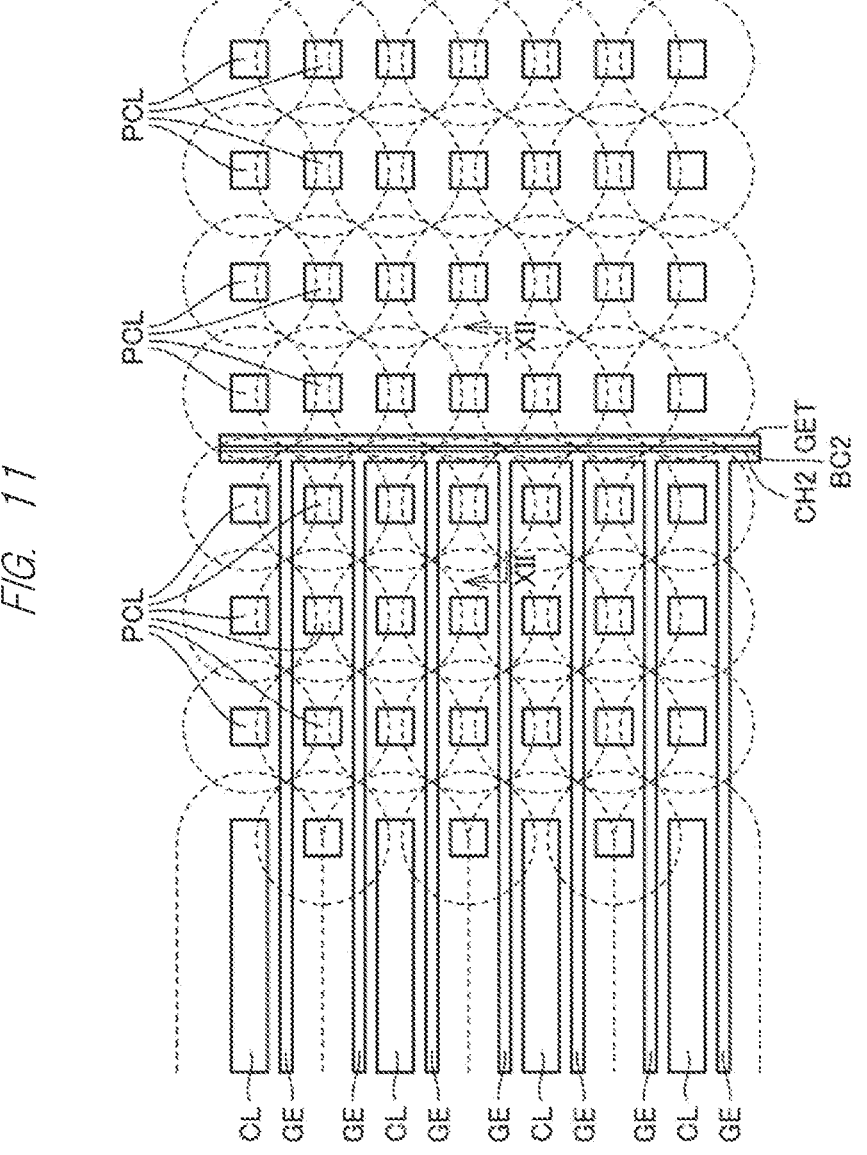
FIG. 11 is a plan view illustrating a configuration of a semiconductor device according to a second comparative example.
Figure 12:
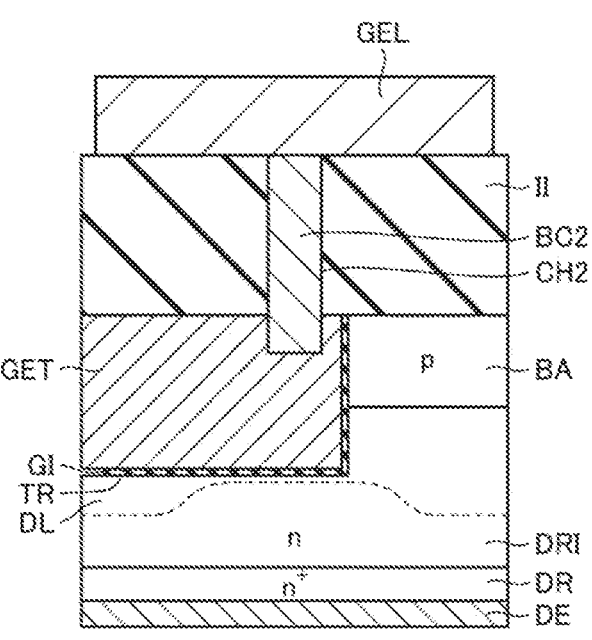
FIG. 12 is a cross-sectional view taken along XII-XII line of FIG. 11.

The second comparative example illustrated in FIG. 11 is a configuration illustrated in FIG. 9 and FIG. 18 of Patent Document 1. In the second comparative example illustrated in FIG. 11, a plurality of dot column regions PCL are arranged between the cell column region CL and the outer peripheral trench gate GET. In addition, on the outer peripheral side of the outer peripheral trench gate GET, a plurality of dot column regions PCL are arranged.

In the configuration of the second comparative example, the dot column regions PCL are arranged in a scattered manner on the cell portion side of the outer peripheral trench gate GET. Therefore, when the planar dimensions of the dot column region PCL is varied, since the depletion layer DL is less likely to extend in the vicinity of the outer peripheral trench gate GET that is away from the dot column region PCL as illustrated in FIG. 12, an electric field concentration is more likely to occur and thus lowering of the breakdown voltage is more likely to occur.

As described above, in any of the first and comparative examples, in the vicinity of the outer peripheral trench gate GET (particularly, in the vicinity of the cell portion side of the outer peripheral trench gate GET), the depletion layer DL is hardly extended, and likely to decrease the breakdown voltage.

Figure 13:
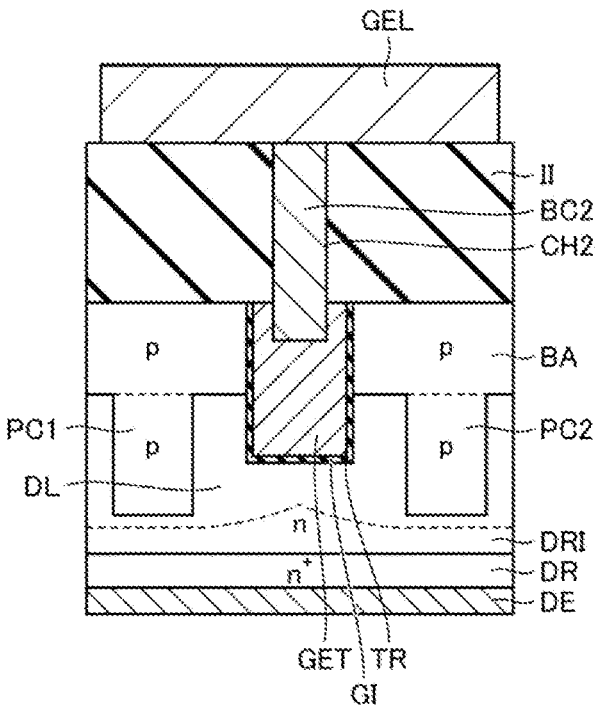
FIG. 13 is a view illustrating a state in which a depletion layer is extended in a cross section along a IIIB-IIIB line of FIG. 2.

In contrast, in the present embodiment, as illustrated in FIG. 2, the outer peripheral column region PC1 is arranged on the cell portion CEL side with respect to the outer peripheral trench gate GET, and extends across a plurality of cell trench gate GE in plan view. Thus, the outer peripheral column region PC1 extends along the outer peripheral trench gate GET. Therefore, even if the line width of the outer peripheral column region PC1 varies, as illustrated in FIG. 13, the depletion layer DL is likely to extend in the vicinity of the cell portion CEL side of the outer trench gate GET, the breakdown voltage is improved.

Further, according to the present embodiment, as illustrated in FIG. 2, the outer peripheral column region PC1 extends over the entire width direction of the cell portion CEL in plan view. Thus, the depletion layer DL is likely to extend in the vicinity of the cell portion CEL side of the outer peripheral trench gate GET over the entire width direction of the cell portion CEL, the breakdown voltage is further improved.

Further, according to the present embodiment, as illustrated in FIG. 2, the outer peripheral column region PC1 surrounds the outer periphery of the cell portion CEL in plan view. Thus, the depletion layer DL is likely to extend in the vicinity of the cell portion CEL side of the outer peripheral trench gate GET over the entire outer periphery of the cell portion CEL, the breakdown voltage is further improved.

Further, according to the present embodiment, as illustrated in FIG. 3, the outer peripheral column region PC2, in plan view, sandwiches the outer peripheral trench gate GET between the outer peripheral column region PC1, and extends over the entire width direction of the cell portion CEL. Thus, as illustrated in FIG. 13, the depletion layer DL is likely to extend in the vicinity of the outer peripheral portion PER side of the outer peripheral trench gate GET, the breakdown voltage is further improved.

Second Embodiment

<Configuration of the Semiconductor Device in the Chip State>

Next, a configuration of a chip state will be described with reference to FIGS. 14 to 16 as a configuration of a semiconductor device according to the second embodiment.

Figure 14:
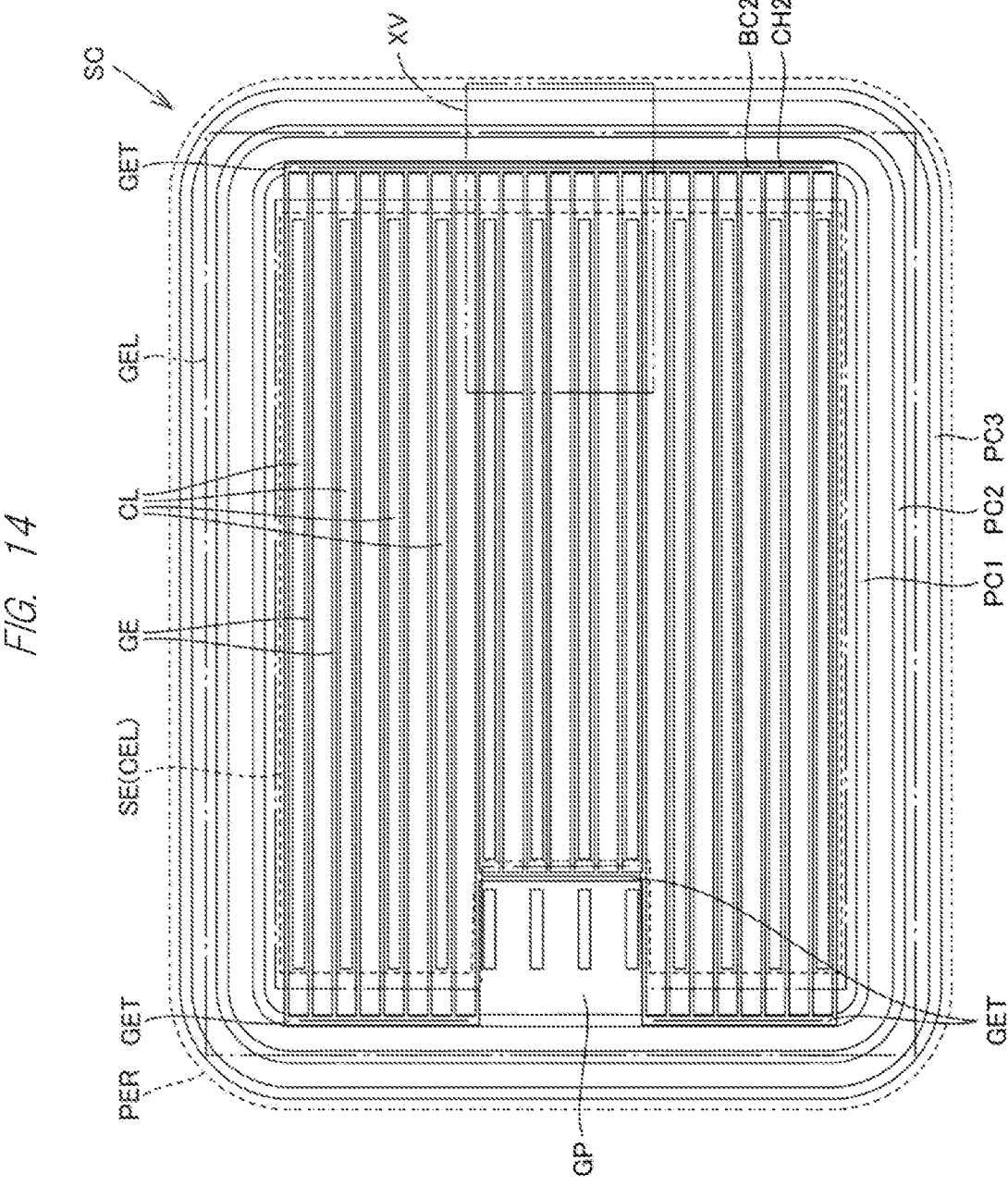
FIG. 14 is a plan view illustrating a configuration in a chip state of a semiconductor device according to a second embodiment.
Figure 15:
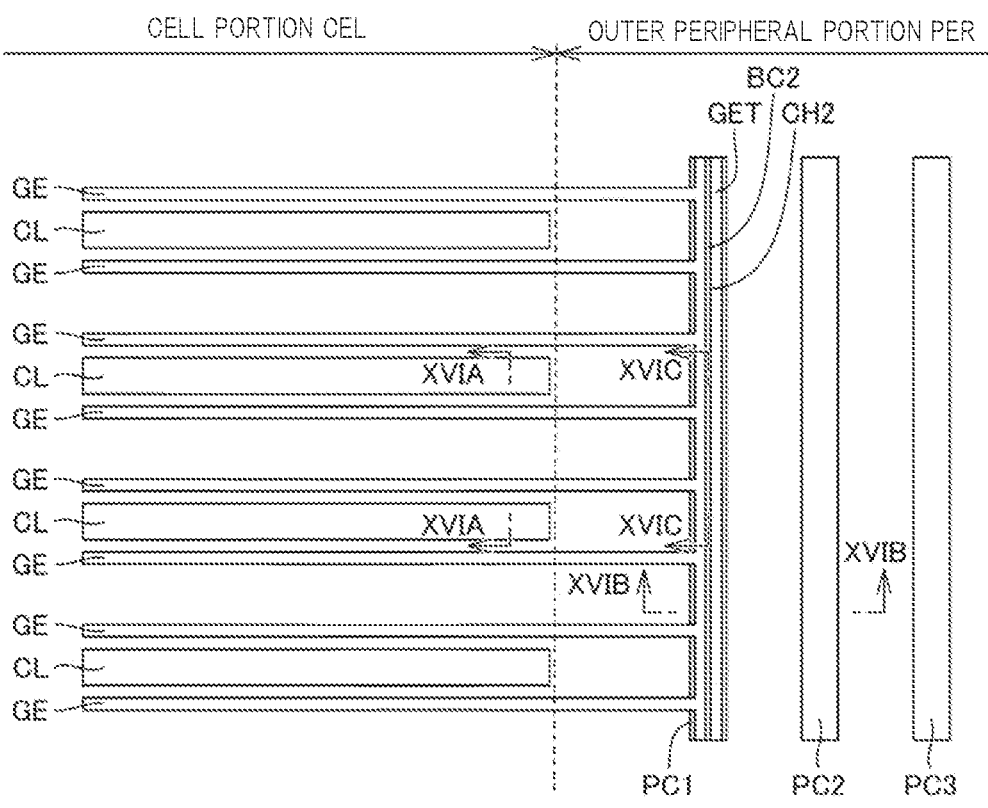
FIG. 15 is an enlarged plan view of the region XV of FIG. 14.

As illustrated in FIGS. 14 and 15, the semiconductor device SC according to the second embodiment, as compared with the configuration of the semiconductor device according to the first embodiment illustrated in FIG. 1, is different in the arrangement position of the outer peripheral column region PC1.

In the present embodiment, the outer peripheral column region PC1 is arranged directly below the outer peripheral trench gate GET. The outer peripheral column region PC1 is arranged directly below the outer peripheral trench gate GET in the entire length of the outer peripheral trench gate GET.

In the present embodiment, other outer peripheral column region is not arranged on the cell portion CEL side with respect to each of the outer trench gate GET and the outer peripheral column region PC1. However, as in the first embodiment, the outer peripheral column region may be added to the cell portion CEL side with respect to each of the outer peripheral trench gate GET and the outer peripheral column region PC1 also in the present embodiment.

Figures 16A, 16B, 16C:
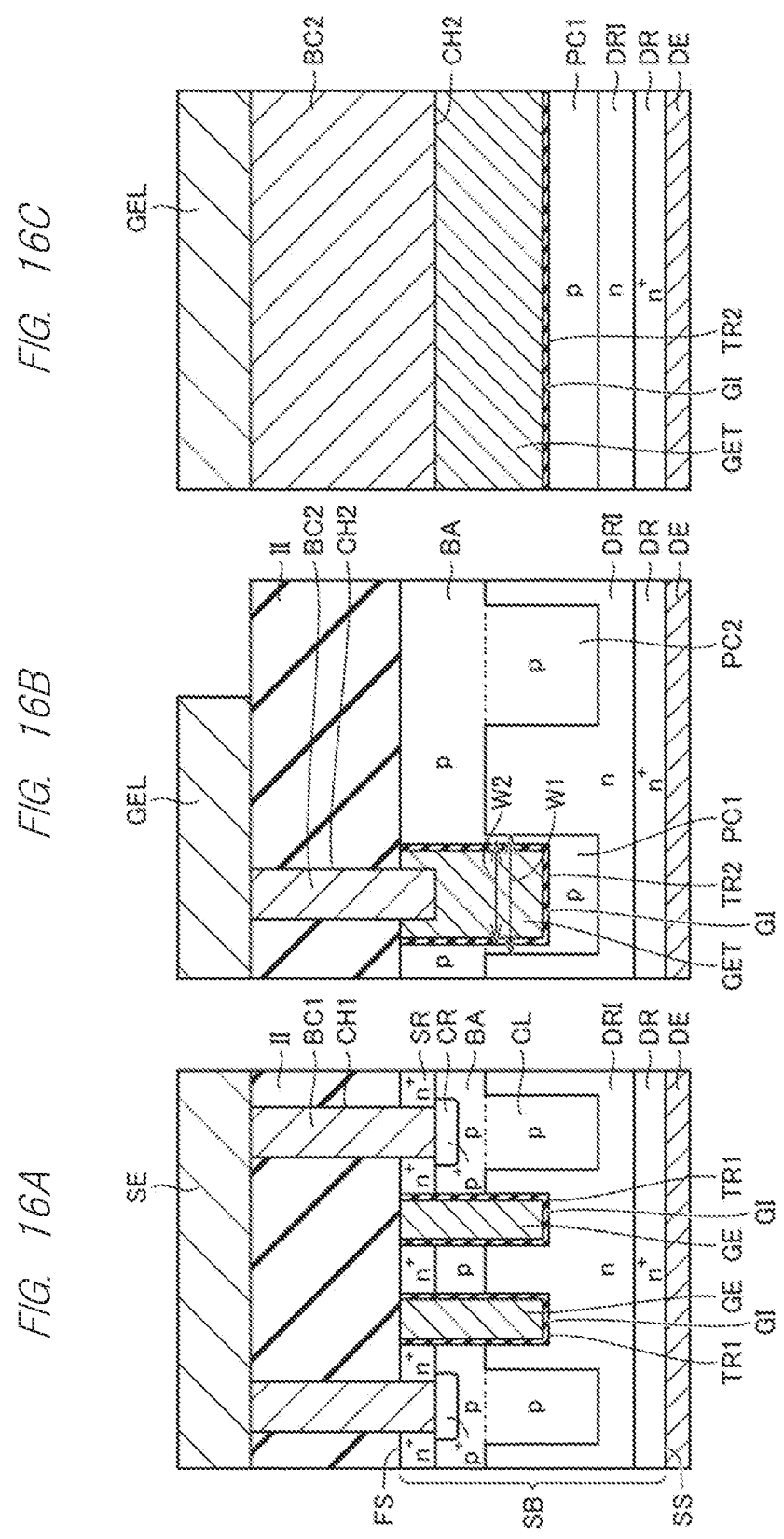
FIG. 16A is a cross-sectional view taken along a XVIA-XVIA line of FIG. 15.
FIG. 16B is a cross-sectional view taken along a XVIB-XVIB line of FIG. 15.
FIG. 16C is a cross-sectional view taken along a XVIC-XVIC line of FIG. 15.
Figures 17A, 17B:
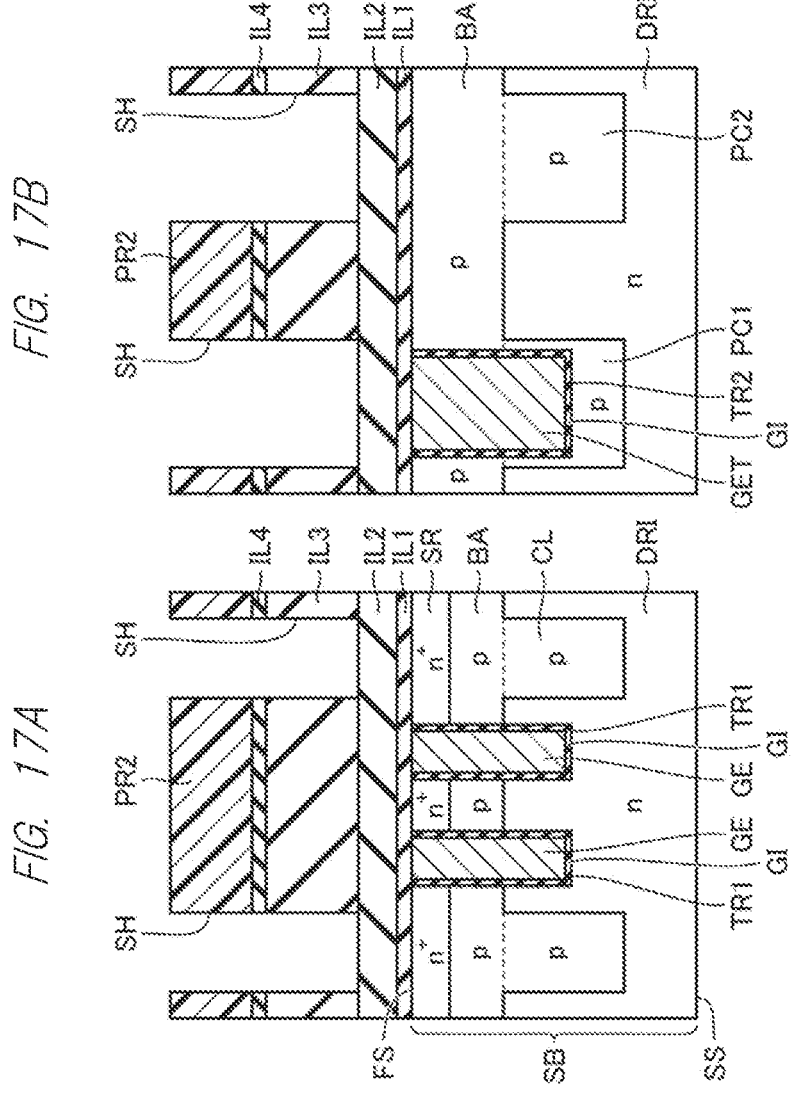
FIG. 17A is a cross-sectional view illustrating a first step of the method of manufacturing the semiconductor device according to the second embodiment.
FIG. 17B is a cross-sectional view illustrating the first step of the method of manufacturing the semiconductor device according to the second embodiment.

As illustrated in FIG. 16B, the width W1 of the outer peripheral column region PC1 is larger than the width W2 of the outer peripheral trench TR2. Therefore, the outer peripheral column region PC1 is in contact with the entire width of the bottom surface of the outer peripheral trench TR2. In addition, the outer peripheral column region PC1 is in contact with both the side surface of the cell portion CEL side and the side surface of the outer peripheral portion PER side of the outer trench TR2.

As illustrated in FIG. 16C, the outer peripheral column region PC1 is in contact with the entire length of the bottom surface of the outer peripheral trench TR2.

Since the configuration of the present embodiment other than the above is substantially the same as the configuration of the first embodiment, the same elements are denoted by the same reference numerals, and description thereof will not be repeated.

<Method of Manufacturing the Semiconductor Device>

Next, a method of manufacturing a semiconductor device according to the present embodiment will be described with reference to FIGS. 17A and 17B to FIGS. 19A and 19B.

The manufacturing method of the semiconductor device according to the present embodiment first undergoes the same manufacturing process as the manufacturing process of the first embodiment illustrated in FIGS. 4 and 5. Thereafter, as illustrated in FIG. 17, on the first surface FS of the semiconductor substrate SB, a silicon oxide film IL1, a silicon nitride film IL2, a silicon oxide film IL3 and a silicon oxide film IL4 are stacked in this order. A photo resist PR2 is applied on the silicon oxide film IL4. Thereafter, the photo resist PR2 is patterned by photolithography techniques (exposure and development, etc.).

Using the patterned photoresist PR2 as a mask, the silicon oxide films IL4 and IL3 are plasma-etched. Thus, the silicon oxide films IL4 and IL3 are selectively etched to expose a portion of the silicon nitride film IL2.

In this state, p-type impurities such as boron are ion-implanted from the first surface FS side of the semiconductor substrate SB. As a result, a cell column region CL is formed in the cell portion CEL, and the outer peripheral column regions PC1 to PC3 are formed in the outer peripheral portion PER.

The outer peripheral column region PC1 is formed so as to be located directly below the outer peripheral trench TR2. Specifically, the outer peripheral column region PC1, in order to contact the entire bottom surface of the outer peripheral trench TR2, is formed so as to contact both the side surfaces of the cell portion CEL side and the side surface of the outer peripheral portion PER side of the outer peripheral trench TR2.

Thereafter, the photo resist PR2 is stripped to be removed. The silicon oxide films IL4, IL3 are etched. The silicon nitride film IL2 is removed by wet etching.

Thereafter, a BPSG (boro-phospho silicate glass) film or the like is formed on the silicon oxide film IL1 using, for example, TEOS (tetra ethyl ortho silicate) as a raw material.

Figures 18A, 18B:
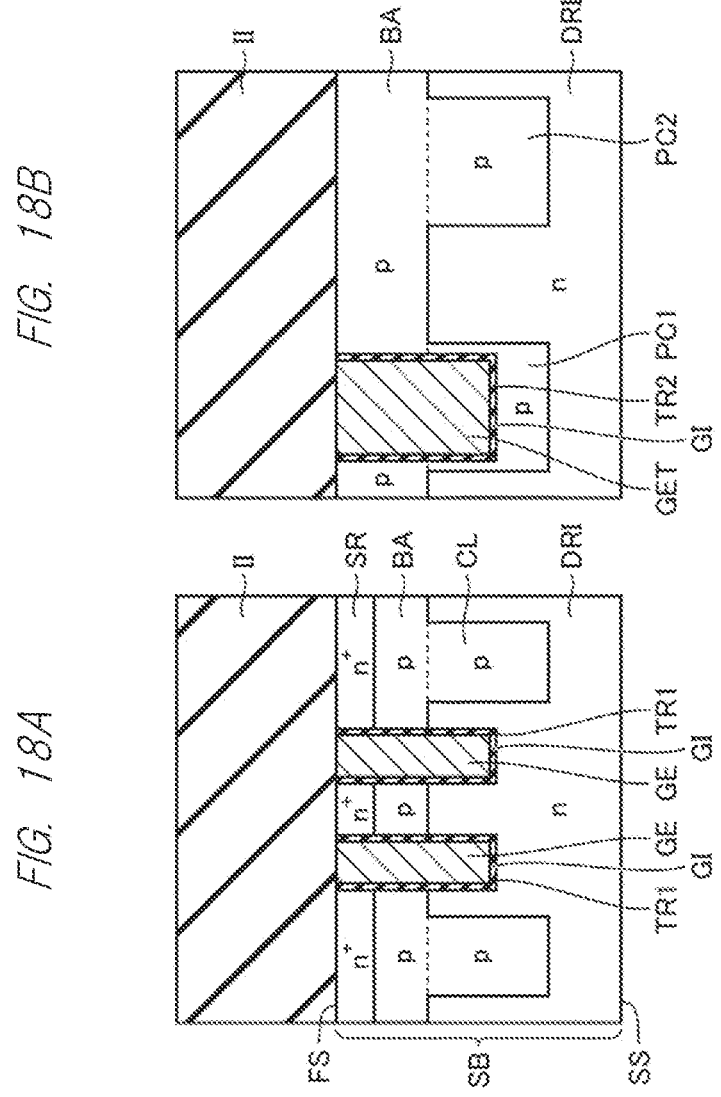
FIG. 18A is a cross-sectional view illustrating a second step of the method of manufacturing the semiconductor device according to the second embodiment.
FIG. 18B is a cross-sectional view illustrating the second step of the method of manufacturing the semiconductor device according to the second embodiment.

As illustrated in FIGS. 18A and 18B, an interlayer insulating layer II is formed of such as silicon oxide film IL1, BPSG film, on the first surface FS of the semiconductor substrate SB.

Figures 19A, 19B:
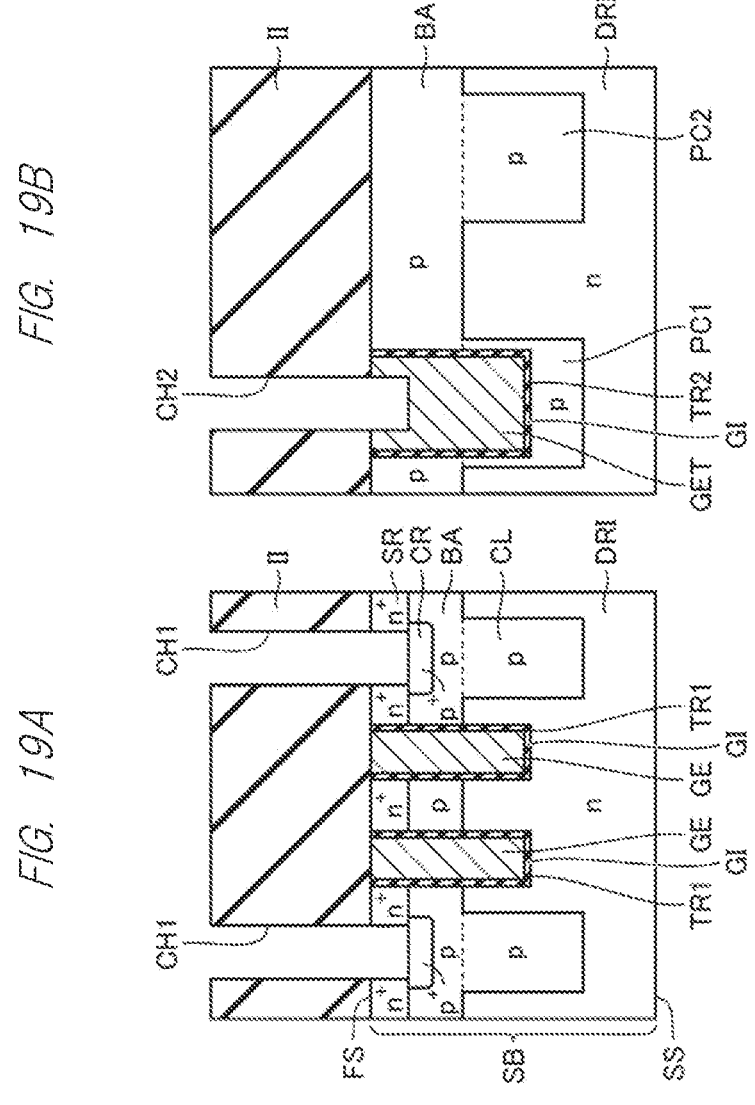
FIG. 19A is a cross-sectional view illustrating a third step of the method of manufacturing the semiconductor device according to the second embodiment.
FIG. 19B is a cross-sectional view illustrating the third step of the method of manufacturing the semiconductor device according to the second embodiment.

As illustrated in FIGS. 19A and 19B, by photoengraving and etching techniques, contact holes CH1, CH2 are formed in the interlayer insulating layer II. The contact hole CH1 is formed not only to penetrate through the inter-layer isolated layer II but also to penetrate through an n+ source-region SR and reach a p-type base region BA. The contact hole CH2 is formed so as to penetrate the interlayer insulating layer II to reach the outer peripheral trench gate GET.

Thereafter, boron fluoride ions are implanted into the semiconductor substrate SB through the contact holes CH1. In this manner, a $p^+$-type contact region CR is formed directly below the contact hole CH1.

As illustrated in FIGS. 16A and 16B, conductive layers BC1 and BC2 are formed in each of the contact holes CH1 and CH2. Each of the conductive layers BC1 and BC2 includes a barrier metal layer and a buried conductive layer. The barrier metal layer is extended along each wall of the contact holes CH1 and CH2, and is formed of, for example, a laminated film of Ti and TiN. The buried conductive layers are embedded in the inside of each of the contact holes CH1, CH2.

On the interlayer insulating layer II, a conductive layer formed of, for example, aluminum or aluminum copper is formed. The conductive layer is patterned by photolithography and etching techniques. Thus, a source electrode SE, and a gate electrode wiring GEL are formed of the conductive layer. The source electrode SE is electrically coupled to each of an n-type source region SR and a $p^+$-type contact region CR via the electrical contact layer BC1. The gate electrode wiring GEL is electrically coupled to the outer peripheral trench gate GET via the conductive layer BC2.

As described above, the semiconductor device of the present embodiment illustrated in FIG. 16 is manufactured.

<Effect>

Next, effects of the present embodiment will be described.

Figure 20:
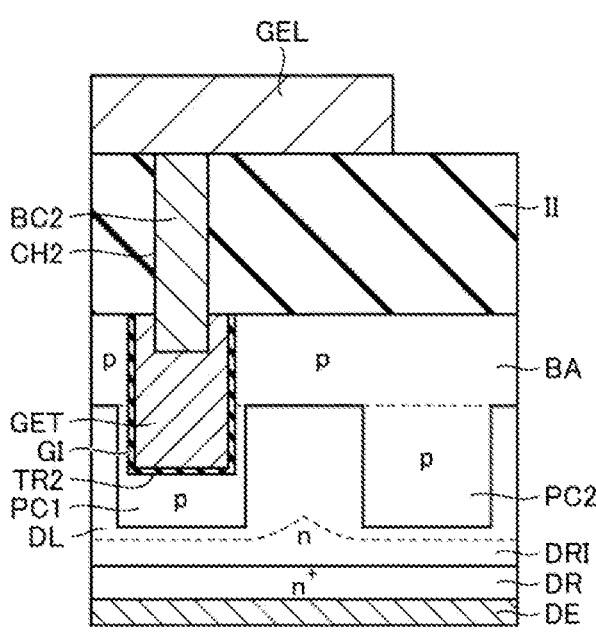
FIG. 20 is a diagram illustrating a state in which a depletion layer is extended in a cross section along a XVIB-XVIB line of FIG. 15.

According to the present embodiment, as illustrated in FIG. 16B and FIG. 16C, the outer peripheral column region PC1 is arranged directly below the outer peripheral trench TR2. Therefore, even if the linewidth of the outer peripheral column region PC1 varies tentatively, as illustrated in FIG. 20, a depletion layer DL is easily spread in the vicinity of the outer peripheral trench gate GET, the breakdown voltage is improved.

Further, according to the present embodiment, as illustrated in FIG. 16B and FIG. 16C, the outer peripheral column region PC1 is in contact with the entire bottom surface of the outer peripheral trench TR2. Thus, the depletion layer DL is more easily spread in the vicinity of the outer peripheral trench TR2, the breakdown voltage is further improved.

Further, according to the present embodiment, as illustrated in FIG. 16B, the outer peripheral column region PC1 is in contact with both the side surface of the cell portion CEL side and the side surface of the outer peripheral portion PER side of the outer peripheral trench TR2. Thus, the depletion layer DL is more easily spread in the vicinity of the outer peripheral trench TR2, the breakdown voltage is further improved.

Further, according to the present embodiment, as illustrated in FIG. 14, the outer peripheral column region PC1 extends over the entire width direction of the cell portion CEL in plan view. Thus, since the outer peripheral trench gate GET near the cell portion CEL side is easily depleted over the entire width direction of the cell portion CEL, the breakdown voltage is further improved.

Further, as illustrated in FIG. 14, according to the present embodiment, the outer peripheral column region PC1 surrounds the outer periphery of the cell portion CEL in plan view. Thus, since the outer peripheral trench gate GET near the cell portion CEL side is easily depleted over the entire outer periphery of the cell portion CEL, the breakdown voltage is further improved.

Although the invention made by the present inventors has been specifically described based on the embodiments, the present invention is not limited to the embodiments described above, and it is needless to say that various modifications can be made without departing from the gist of the invention.

What is claimed is:

1. A semiconductor device comprising:
a semiconductor substrate including a first surface and a second surface opposite the first surface;
a cell portion having an insulated gate field effect transistor formed on the semiconductor substrate; and
an outer peripheral portion located outside of the cell portion at the first surface, wherein the cell portion includes:
a source region arranged on the first surface of the semiconductor substrate without being arranged in the outer peripheral portion;
a first portion of a base region arranged under the source region;
a first cell column region and a second cell column region arranged on the semiconductor substrate to be adjacent to each other in plan view, each of the first cell column region and the second cell column region protruding from a bottom portion of the first portion of the base region toward the second surface; and
a first cell trench gate and a second cell trench gate penetrating through each of the source region and the first portion of the base region, the first cell trench gate and the second cell trench gate being arranged adjacent each other between the first cell column region and the second cell column region in plan view without any cell column region being formed anywhere between the first cell trench gate and the second cell trench gate in the cell portion in plan view, and
wherein the outer peripheral portion includes:
a second portion of the base region arranged on the first surface of the semiconductor substrate;
an outer peripheral trench gate penetrating through the second portion of the base region and connected to an end portion of each of the first cell trench gate and the second cell trench gate in plan view; and
a first outer peripheral column region arranged closer to the cell portion than the outer peripheral trench gate, and extending across the first cell trench gate and the second cell trench gate in plan view, the first outer peripheral column region contacting both the first cell trench gate and the second cell trench gate.

2. The semiconductor device according to claim 1, wherein the first outer peripheral column region is extended over an entire width direction of the cell portion in plan view.

3. The semiconductor device according to claim 2, wherein the first outer peripheral column region is formed to surround an outer periphery of the cell portion in plan view.

4. The semiconductor device according to claim 1, wherein the outer peripheral portion further includes a second outer peripheral column region, and
wherein the second outer peripheral column region sandwiches the outer peripheral trench gate with the first outer peripheral column region in plan view, and is extended over an entire width direction of the cell portion.

* * * * *